(12) United States Patent
Matsumoto

(10) Patent No.: US 6,387,851 B1
(45) Date of Patent: May 14, 2002

(54) MICRO-FABRICATION METHOD AND EQUIPMENT THEREBY

(75) Inventor: Takao Matsumoto, Iruma (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/464,441

(22) Filed: Dec. 16, 1999

(30) Foreign Application Priority Data

Dec. 24, 1998 (JP) ............................................. 10-366338

(51) Int. Cl.[7] .............................. B05D 3/10; B05D 5/12; B44C 1/22; C03C 25/68; C23F 1/00
(52) U.S. Cl. ..................... 505/410; 505/413; 505/470; 216/99; 216/108; 204/192.24
(58) Field of Search ................................ 216/3, 99, 96, 216/108; 204/192.1, 192.24, 192.37; 427/309; 438/3, 745; 505/410, 413, 470, 728

(56) References Cited

U.S. PATENT DOCUMENTS

| | | | |
|---|---|---|---|
| 3,765,969 A | | 10/1973 | Kragness et al. |
| 5,248,663 A | * | 9/1993 | Noshiro et al. ................ 505/1 |
| 5,256,897 A | * | 10/1993 | Hasegawa et al. .......... 257/613 |
| 5,312,803 A | * | 5/1994 | Tanaka et al. ............... 505/471 |
| 5,840,204 A | * | 11/1998 | Inada et al. .................... 216/95 |

* cited by examiner

*Primary Examiner*—Mark Kopec
(74) *Attorney, Agent, or Firm*—Mattingly, Stanger & Malur, P.C.

(57) ABSTRACT

An $SrTiO_3$ monocrystal substrate having a crystallographic plane (100) or (110) is anisotropically etched in an $H_3PO_4$ solution using an $SiO_2$ thin film as an etching mask. The $H_3PO_4$ solution is maintained at a boiling point of approximately 150 deg. C. for increasing an etching rate and enhancing selectivity for protection with the $SiO_2$ thin film mask.

10 Claims, 14 Drawing Sheets

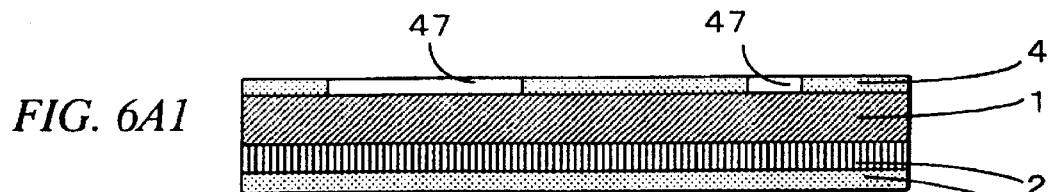
*FIG. 6A1*
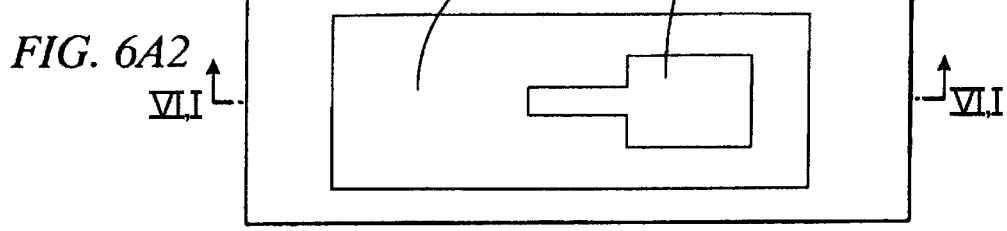
*FIG. 6A2*
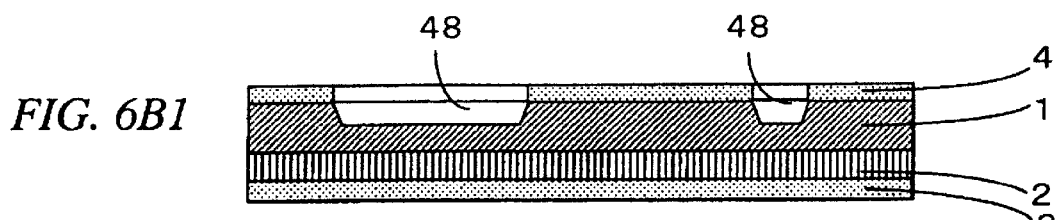
*FIG. 6B1*
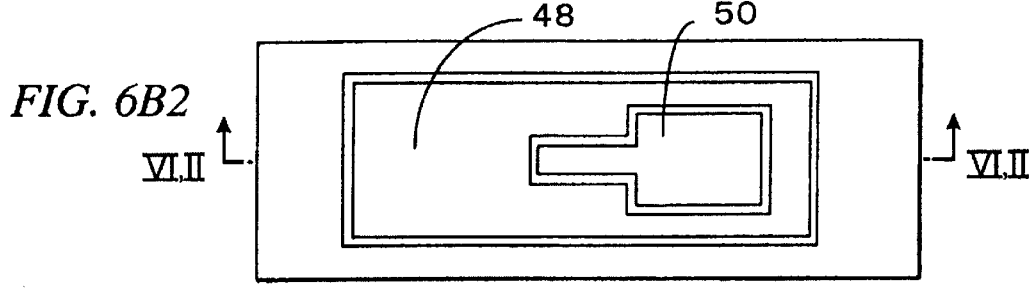
*FIG. 6B2*
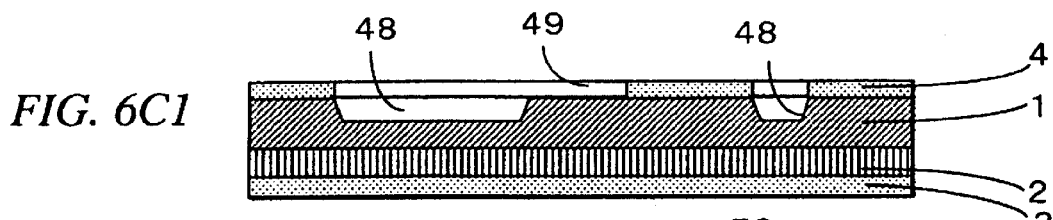
*FIG. 6C1*
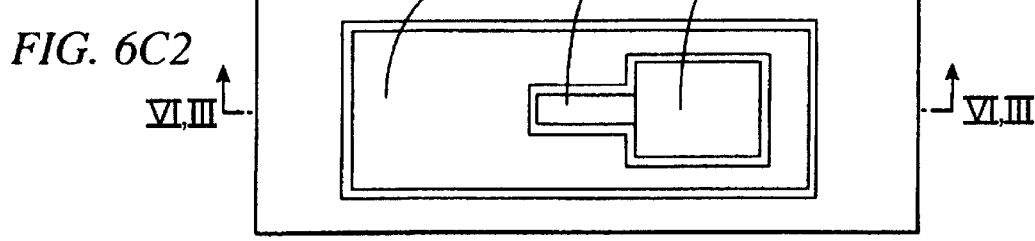
*FIG. 6C2*

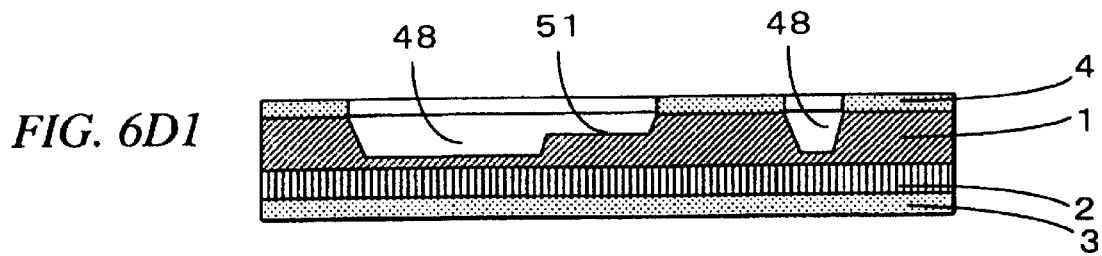
FIG. 6D1
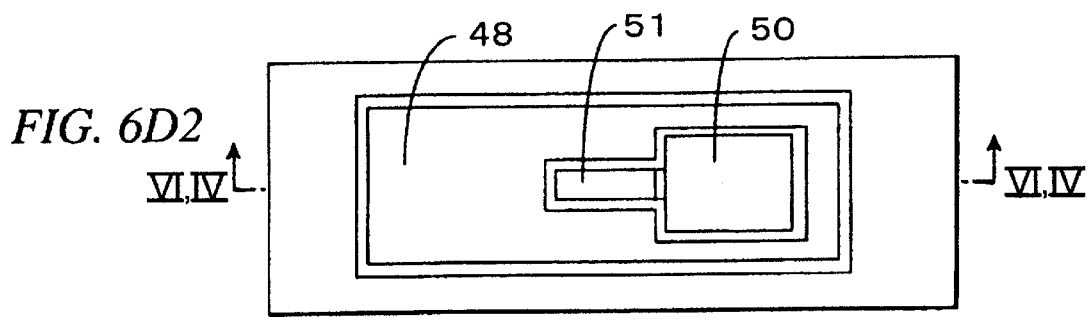
FIG. 6D2
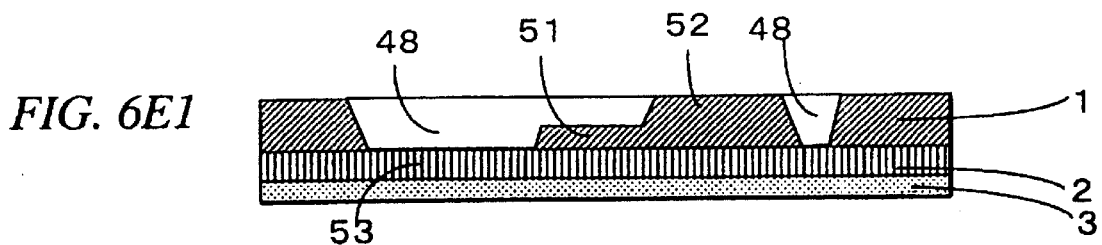
FIG. 6E1
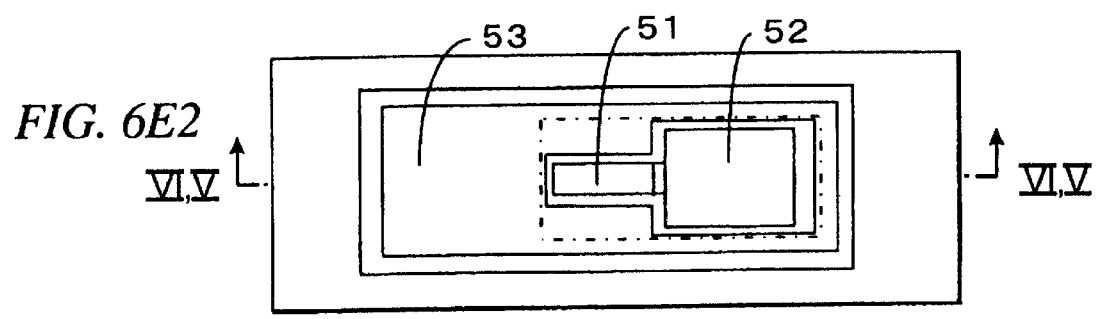
FIG. 6E2

MICRO-FABRICATION METHOD AND EQUIPMENT THEREBY

BACKGROUND OF THE INVENTION

1. Field of the Invention

The present invention relates to a microfabrication method and devices fabricated using the same. More particularly, the invention pertains to a microfabrication method suitable for fabricating microstructures comprising parts made of high-temperature superconductor material or $SrTiO_3$ monocrystalline material, e.g., a microfabrication method suitable for fabricating microstructure devices such as a magnetic force microscope probe and a magnetic field sensor.

2. Description of the Related Art

Recent years have seen significant advances in a variety of applications using a micromachining technique based on silicon semiconductor microfabrication processing. In these applications, silicon crystal anisotropic etching with an alkali etchant such as potassium hydroxide has been used as a basic microfabrication method (found in U.S. Pat. No. 3,765,969). More specifically, since an etching rate is substantially lower on a crystallographic plane (111) than on planes (100) and (110) under particular etching conditions, precision three-dimensional micromachining can be carried out using a proper mask. In the micromachining, it is common practice to use silicon as a material on account of convenience that the semiconductor microfabrication technique is applicable thereto in a similar fashion.

SUMMARY OF THE INVENTION

In the conventional semiconductor microfabrication technique mentioned above, however, no consideration is given to implementation of fabricating microstructures made of any material other than silicon, i.e., it is difficult to apply the conventional semiconductor microfabrication technique to fabrication of microstructures made of non-silicon material. In formation of a thin film of high-temperature superconductor, it is required to use a proper monocrystal substrate. In the case of forming a high-temperature superconductor thin film $YBa_2Cu_3O_{7-\delta}$, for example, a monocrystal substrate $SrTiO_3$ is used to attain satisfactory results of fabrication. However, an etchant effective for $SrTiO_3$ monocrystal, which is analogous to potassium hydroxide for silicon, has not been known heretofore. The $SrTiO_3$ monocrystal is not etched at all by an etchant such as potassium hydroxide used for silicon crystal anisotropic etching.

For anisotropic etching, a physical etching method is available as well as a chemical etching method. In the physical etching method, however, an etching rate is relatively low. In particular, a material such as $SrTiO_3$ monocrystal is hardly etched by the physical etching method under ordinary conditions for silicon etching. Even in the case of silicon etching, the physical etching method takes an impractically long period of time to accomplish penetration etching through a thick silicon substrate.

For silicon material, a physico-chemical etching method using a combination of plural kinds of special gases has been developed to attain an etching rate which is approximately 1000 times higher than that in a conventional method. Using the physico-chemical method, it is possible to accomplish silicon etching within a practically allowable period of time. In contrast, for $SrTiO_3$ monocrystal material, such a desirable etching method has not yet been established.

Besides, the following approach has been proposed: After a thin film of $SrTiO_3$ monocrystal is grown on a silicon substrate which allows anisotropic etching, a thin film of high-temperature superconductor $YBa_2Cu_3O_{7-\delta}$ is grown over the grown thin film of $SrTiO_3$ monocrystal. However, satisfactory results have not yet been attained in this approach. The physical etching method is also disadvantageous in that a damage is likely to be involved in a processed surface and in that there is a difficulty in controlling an angle of processing. For instance, it is known that a Josephson junction can be provided by forming a step difference part on the surface of an $SrTiO_3$ monocrystal substrate through physical etching and then growing a thin film of high-temperature superconductor thereon. However, since the performance of a junction formed using a step difference part largely depends on conditions of the angle and surface of the step difference part, it is not practicable to fabricate a Josephson junction device having high performance stability by using a step difference part formed through physical etching.

It is therefore an object of the present invention to provide a method of precise microfabrication of an $SrTiO_3$ monocrystal substrate by growing a high-temperature superconductor thin film thereon.

Another object of the present invention is to provide a device comprising a part made of a high-temperature superconductor thin film fabricated by the above-mentioned method.

A further object of the present invention is to provide a device having a dielectric property of an $SrTiO_3$ monocrystal substrate fabricated by the above-mentioned method.

The above and other objects, features and advantages of the present invention will become more apparent from the following detailed description with reference to the accompanying drawings.

BRIEF DESCRIPTION OF THE DRAWINGS

FIGS. 6A1 to 6I are sectional views and plan views showing an example of a fabrication process of a probe for a magnetic force microscope (MFM) according to another preferred embodiment of the present invention;

DESCRIPTION OF THE PREFERRED EMBODIMENTS

The present invention will now be described in detail by way of example with reference to the accompanying drawings.

In carrying out the present invention and according to one aspect thereof, there is provided a microfabrication method comprising the steps of: preparing an $SrTiO_3$ monocrystal substrate having a (100) plane on a surface thereof; forming an $SiO_2$ film etching mask on the (100) plane of the $SrTiO_3$ monocrystal substrate; immersing the $SrTiO_3$ monocrystal substrate in an $H_3PO_4$ solution; and heating the $H_3PO_4$ solution to form a predetermined configuration on the $SrTiO_3$ monocrystal substrate as defined by the etching mask. According to another aspect of the present invention, there is provided a microfabrication method comprising the steps of: preparing an $SrTiO_3$ monocrystal substrate having a (110) plane on a surface thereof; forming an $SiO_2$ film etching mask on the (110) plane of the $SrTiO_3$ monocrystal substrate; immersing the $SrTiO_3$ monocrystal substrate in an $H_3PO_4$ solution; and heating the $H_3PO_4$ solution to form a predetermined configuration on the $SrTiO_3$ monocrystal substrate as define by the etching mask.

Although the etching with an $H_3PO_4$ solution proceeds even at a low temperature of approximately 80 deg. C, it is preferable to use an $H_3PO_4$ solution maintained at a boiling point of approximately 150 deg. C for the purpose of increasing an etching rate and enhancing selectivity for protection with $SiO_2$ used as an etching mask. A method of etching with an $H_3PO_4$ solution maintained at the above-indicated boiling point has been employed in a process for etching $Si_3N_4$ (silicon nitride film) in conventional practice of silicon semiconductor microstructure fabrication, and it is known that $SiO_2$ is hardly etched under this etching condition. Therefore, an $SrTiO_3$ monocrystal substrate can be precisely processed by etching with an $H_3PO_4$ solution using an $SiO_2$ thin film as an etching mask in a fashion similar to that in silicon etching with a KOH (potassium hydroxide) solution by the use of an $Si_3N_4$ thin film etching mask.

Embodiment I

FIGS. 1A to 1G show an example of a fabrication process of a self-supporting film for a $YBa_2Cu_3O_{7-\delta}$ high-temperature superconductor thin film formed on a (100) $SrTiO_3$ monocrystal substrate.

Figure 1A:
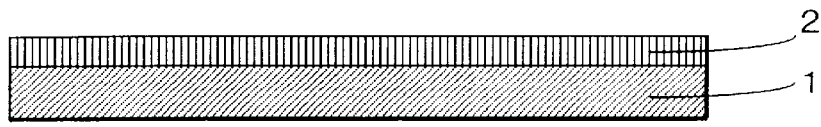
FIGS. 1A to 1G are sectional views showing an example of a fabrication process of a self-supporting film for a thin film made of high-temperature superconductor $YBa_2Cu_3O_{7-\delta}$ according to a preferred embodiment of the present invention.
Figure 1B:
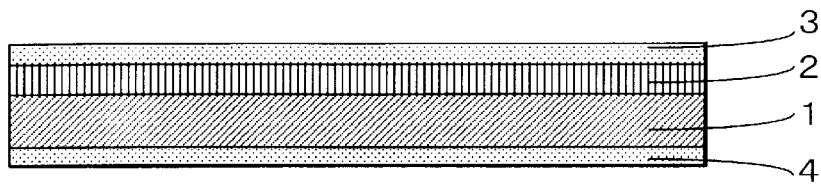

First, on a double-side polished (100) $SrTiO_3$ monocrystal substrate 1 having a thickness of approximately 250 µm, a $YBa_2Cu_3O_{7-\delta}$ high-temperature superconductor thin film 2 is epitaxially grown to have a thickness of approximately 200 nm (FIG. 1A). At this step, if necessary, the $YBa_2Cu_3O_{7-\delta}$ high-temperature superconductor thin film 2 may be patterned by a method such as ion milling with argon ions or the like.

Then, $SiO_2$ thin films 3 and 4 each having a thickness of approximately 1000 nm are evaporated onto the front and back sides of the $SrTiO_3$ monocrystal substrate 1, respectively. The $SiO_2$ thin film 3 on the front side is used for protecting the $YBa_2Cu_3O_{7-\delta}$ high-temperature superconductor thin film 2 against an etchant, and the $SiO_2$ thin film 4 on the back side is used for forming a mask in the etching of the $SrTiO_3$ monocrystal substrate 1.

Figure 1C:
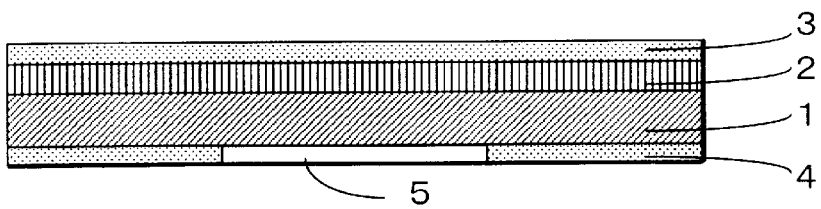

On the $SiO_2$ thin film 4 deposited on the back side, a predetermined etching mask is patterned by an ion etching method using a reactant gas such as $CHF_3$. Thus, a window 5 is formed in the $SiO_2$ thin film 4 (FIG. 1C).

Figure 1D:
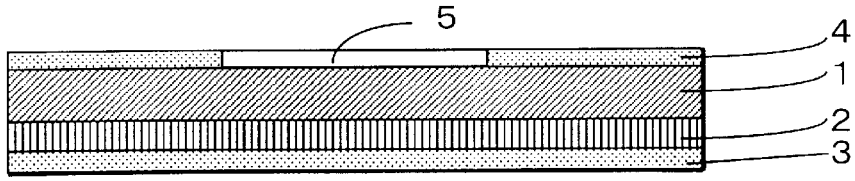

FIG. 1D shows a state in which the $SrTiO_3$ monocrystal substrate 1 thus far processed is turned upside down. At this step, using silicone rubber, the entire substrate may be closely attached to another substrate made of a material such as slide glass resistant to etching with an $H_3PO_4$ solution (not shown). Thus, the substrate can be protected against any etching other than that through the window 5.

Figure 1E:
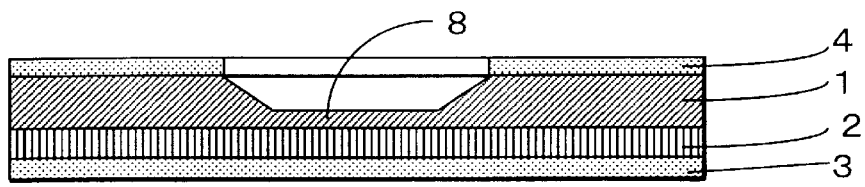

The $SrTiO_3$ monocrystal substrate 1 processed as mentioned above is put into an $H_3PO_4$ solution maintained at a boiling point of approximately 150 deg. C to make anisotropic etching on the $SrTiO_3$ monocrystal substrate 1 through the window 5. The anisotropic etching is terminated by selecting a proper period of etching time (FIG. 1E).

At this step, a part indicated by reference numeral 8 is preferably left in the $SrTiO_3$ monocrystal substrate 1 to provide a proper mechanical strength for preventing possible damage in separation of the entire substrate from a slide glass plate 7.

Figure 1F:
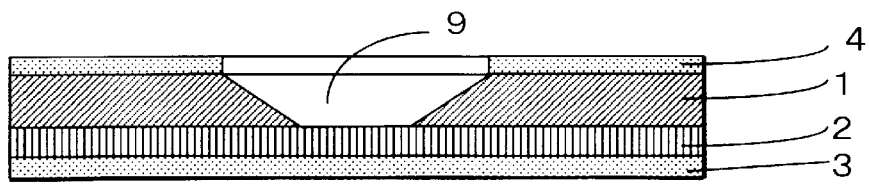

In this state, the $SrTiO_3$ monocrystal 1 is etched in a $H_3PO_4$ solution maintained at a temperature of approximately 80 deg. C to form a through opening 9 in the $SrTiO_3$ monocrystal substrate 1 (FIG. 1F).

Figure 1G:
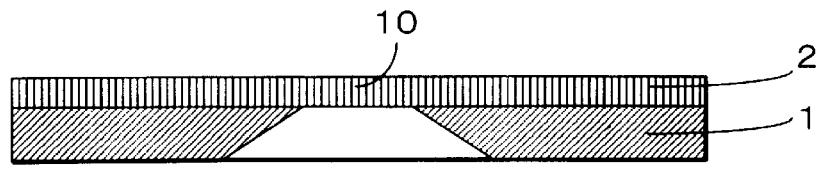

Finally, the $SiO_2$ thin film 4 used for patterning and the $SiO_2$ thin film 3 used for protecting the $YBa_2Cu_3O_{7-\delta}$ high-temperature superconductor thin film 2 are removed by an ion etching method using a reactant gas such as $CHF_3$. Thus, a self-supporting film 10 can be formed for the $YBa_2Cu_3O_{7-\delta}$ high-temperature superconductor thin film (FIG. 1G).

Embodiment II

FIGS. 2A to 2F are sectional views showing an example of a fabrication process of a self-supporting film for a $YBa_2Cu_3O_{7-\delta}$ high-temperature superconductor thin film according to another preferred embodiment of the present invention. In this example, a self-supporting film is formed for a $YBa_2Cu_3O_{7-\delta}$ on a (100) $SrTiO_3$ monocrystal substrate.

Figure 2A:
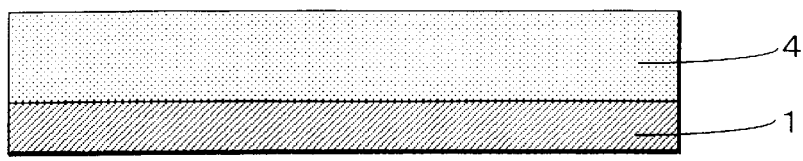
FIGS. 2A to 2F are sectional views showing an example of a fabrication process of a self-supporting film for a thin film made of high-temperature superconductor $YBa_2Cu_3O_{7-\delta}$ according to another preferred embodiment of the present invention.

First, on a double-side polished (100) $SrTiO_3$ monocrystal substrate 1 having a thickness of approximately 250 μm, an $SiO_2$ thin film having a thickness of approximately 1000 nm is evaporated (FIG. 2A).

Figure 2B:
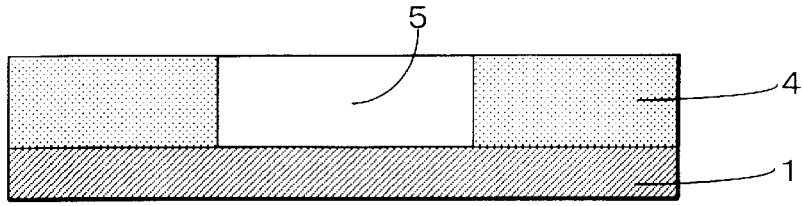

Then, by an ion etching method using a reactant gas such as $CHF_3$, a predetermined etching mask is patterned on the $SiO_2$ thin film 4 to form a window 5 (FIG. 2B).

Figure 2C:
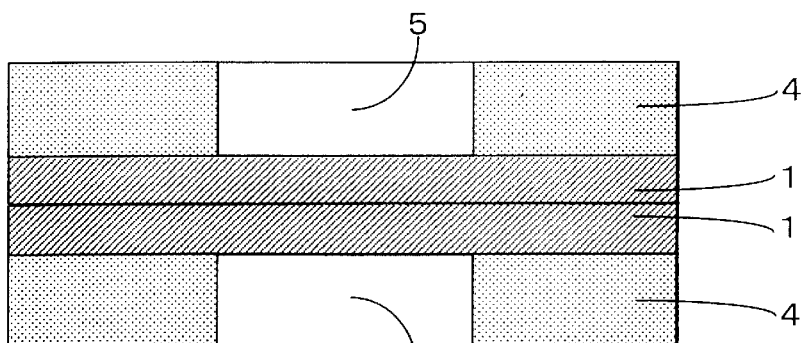

The above steps are repeated to prepare the other $SrTiO_3$ monocrystal substrate 1. The two $SrTiO_3$ monocrystal substrates 1 thus processed are closely attached to each other so that their surfaces not having the evaporated $SiO_2$ thin film 4 and the patterned window 5 are mated mutually (FIG. 2C). At this step, using silicone rubber, the periphery of these substrates may be sealed for protection against an etchant (not shown).

The $SrTiO_3$ monocrystal substrates 1 thus combined are put into an $H_3PO_4$ solution maintained at a boiling point of approximately 150 deg. C to make anisotropic etching on each of the $SrTiO_3$ monocrystal substrates 1. A proper period of etching time is selected to form an opening 5. The anisotropic etching is terminated so that a part indicated by reference numeral 8 is left to provide a proper mechanical strength on each of the $SrTiO_3$ monocrystal substrates 1 (FIG. 2D).

Then, the two $SrTiO_3$ monocrystal substrates 1 are separated from each other. On each one of these substrates, a $YBa_2Cu_3O_{7-\delta}$ high-temperature superconductor thin film 2 having a thickness of approximately 200 nm is epitaxially grown over the surface thereof which does not have the evaporated $SiO_2$ thin film 4 and the patterned window 5 (FIG. 2E).

Finally, a film part 8 remaining in the $SrTiO_3$ monocrystal substrate 1 is removed by ion etching with argon ions or the like to form an opening 9. Further, the $SiO_2$ thin film 4 used for patterning is removed by an ion etching method using a reactant gas such as $CHF_3$. Thus, a self-supporting film 10 can be formed for the $YBa_2Cu_3O_{7-\delta}$ high-temperature superconductor thin film (FIG. 2F).

Figure 2D:
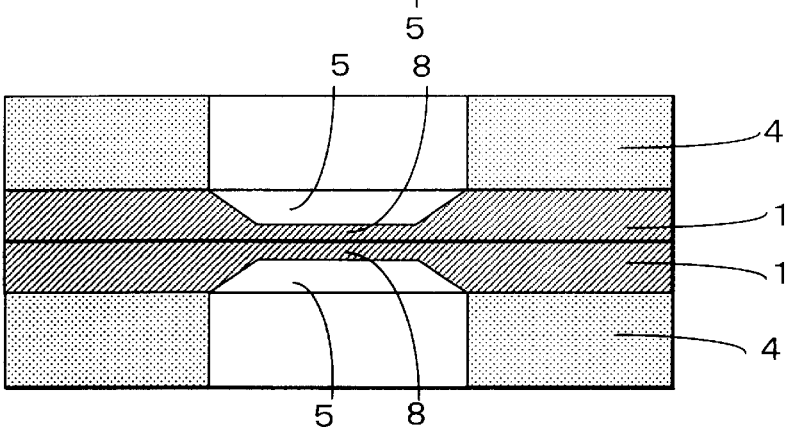
Figure 2E:
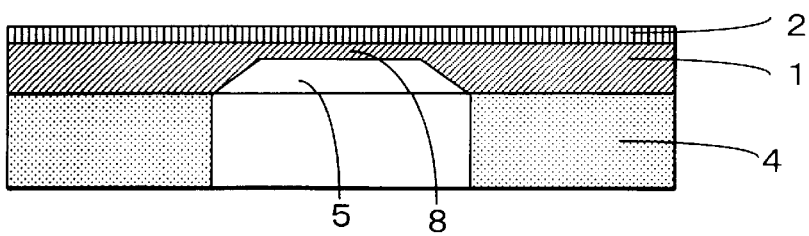
Figure 2F:
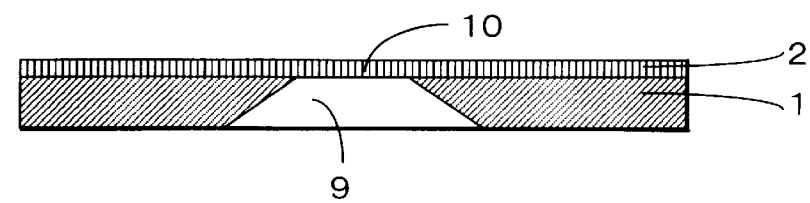

Although the present preferred embodiment is essentially the same as Embodiment I, the present preferred embodiment allows two $SrTiO_3$ monocrystal substrates 1 to be processed in parallel at a step shown in FIG. 2D, resulting in an improvement in workability.

Embodiment III

Figure 3A:
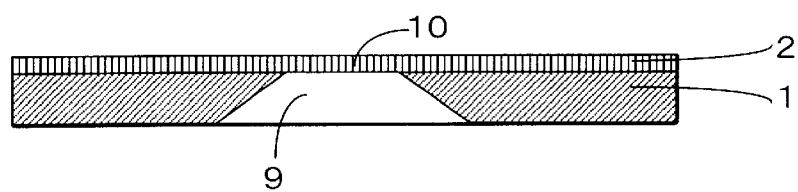
FIGS. 3A and 3B are sectional views showing a fabrication process of a micro magnetic field sensor according to the present invention.
Figure 3B:
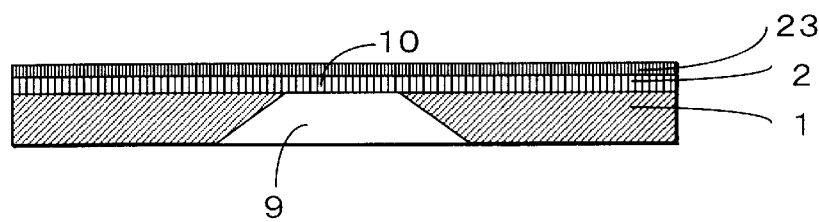
Figure 3C:
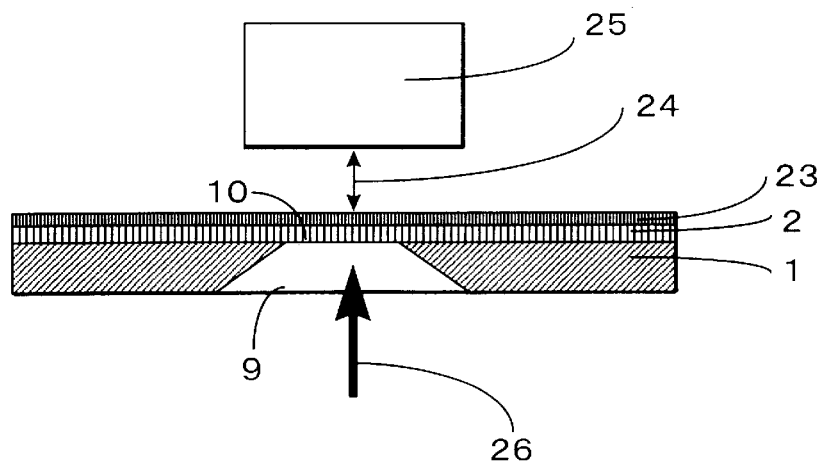
FIG. 3C is a schematic diagram showing operations of the micro magnetic field sensor.

FIGS. 3A and 3B are sectional views showing a fabrication process of a micro magnetic field sensor according to the present invention, and FIG. 3C is a schematic diagram showing operations of the micro magnetic field sensor. An application example of the self-supporting film 10 fabricated for the $YBa_2Cu_3O_{7-\delta}$ high-temperature superconductor thin film in Embodiment I or II is described below with reference to these drawing figures.

FIG. 3A shows the self-supporting film 10 fabricated for the $YBa_2Cu_3O_{7-\delta}$ high-temperature superconductor thin film in Embodiment I or II.

On the self-supporting film 10, a metal thin film 23 is evaporated for enhancement in photoreflective characteristic (FIG. 3B).

When the self-supporting film 10 is cooled down to have a superconducting state, the self-supporting film 10 is distorted by the Meissner effect according to an external magnetic field 26. Based on this principle, a degree of distortion is measured by means of a laser beam 24 from a laser interferometer 25 containing a laser source. Thus, a micro magnetic field sensor can be realized (FIG. 3C).

Figure 4A:
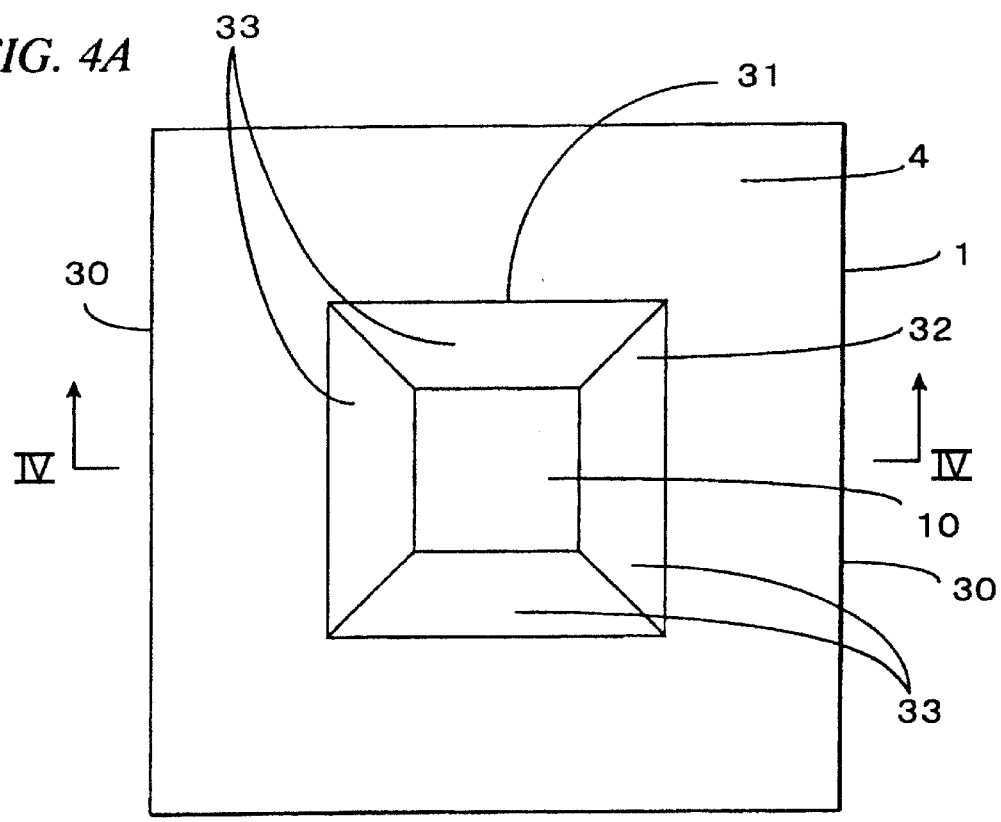
FIG. 4A is a plan view showing an $SiO_2$ thin film mask pattern used for precision etching of a (100) $SrTiO_3$ monocrystal substrate and a fabrication state of the substrate in an example according to another preferred embodiment of the present invention.
Figure 4B:
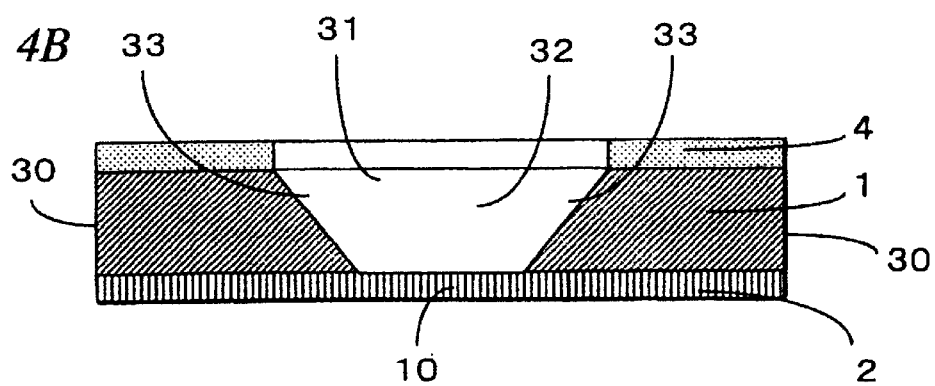
FIG. 4B is a sectional view taken along line IV—IV as seen in the direction of the arrow in FIG. 4A.

In Embodiment I or II, a configuration of a window formed in an $SiO_2$ thin film and a microstructure formed in an $SrTiO_3$ monocrystal substrate by means of etching differ depending on whether a (100) $SrTiO_3$ monocrystal substrate or a (110) $SrTiO_3$ monocrystal substrate is used. FIG. 4A is a plan view showing an $SiO_2$ thin film mask pattern used for precision etching of a (100) $SrTiO_3$ monocrystal substrate and a fabrication state of the substrate in an example, and FIG. 4B is a sectional view taken along line IV—IV as seen in the direction of the arrow in FIG. 4A. In these drawing figures, reference numeral 1 indicates a (100) $SrTiO_3$ monocrystal substrate, and a side face 30 of the substrate 1 has a (110) plane.

On the surface of the substrate 1, an $SiO_2$ thin film is formed in the same manner as in Embodiment I or II. Then, a rectangular window 31 is formed in the $SiO_2$ thin film, and the same process steps as those in Embodiment I or II are carried out. In this example, as shown in FIG. 4B, an inverted pyramidal opening 32 is formed in the substrate 1. Finally, a $YBa_2Cu_3O_{7-\delta}$ high-temperature superconductor thin film 2 is exposed to form a self-supporting film 10. At this step, a (111) plane is exposed on an internal side wall 33 of an opening 32. Thereafter, the $SiO_2$ thin film 4 used for patterning is removed.

Figure 5A:
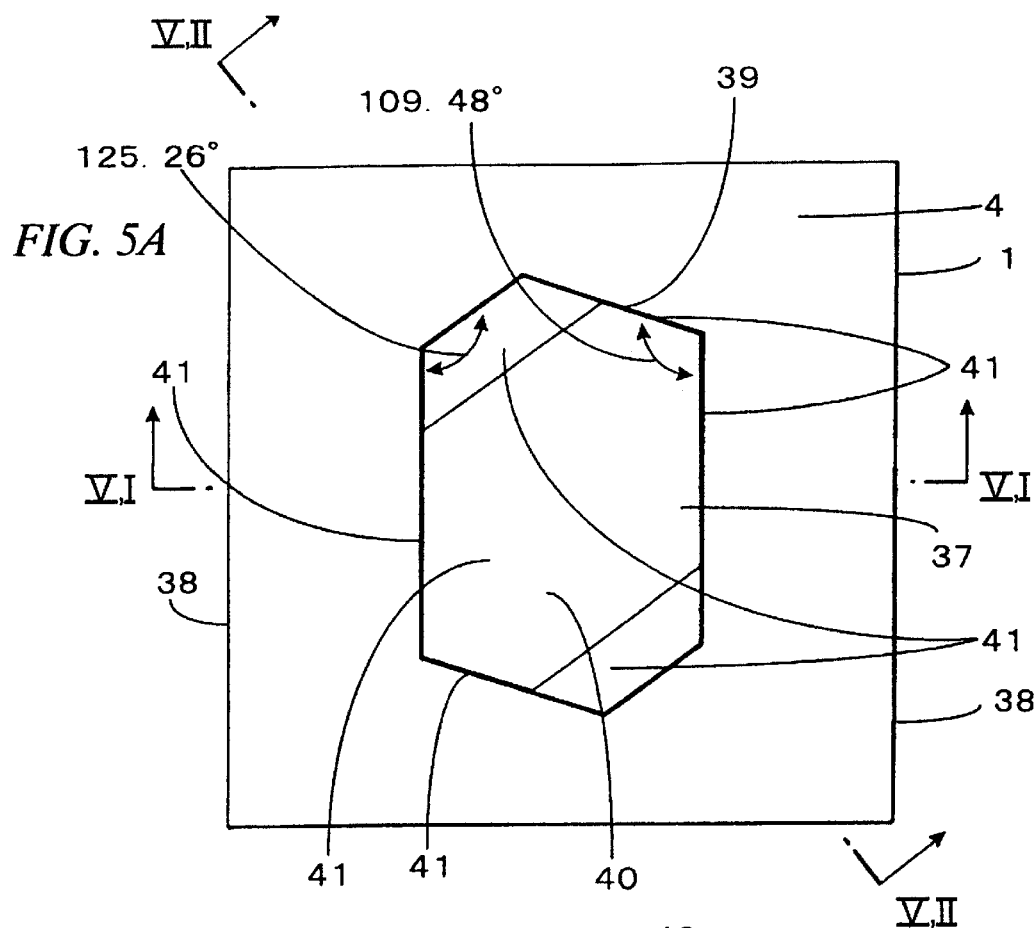
FIG. 5A is a plan view showing an $SiO_2$ thin film mask pattern used for precision etching of a (110) $SrTiO_3$ monocrystal substrate and a fabrication state of the substrate in an example according to another preferred embodiment of the present invention.
Figure 5B:
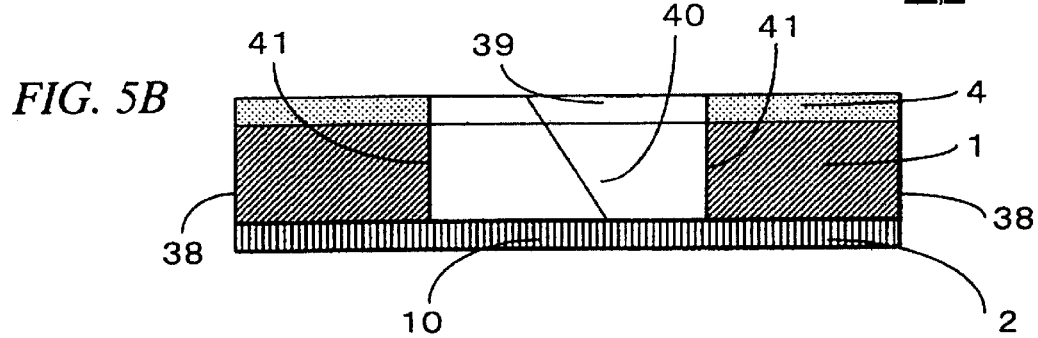
FIG. 5B is a sectional view taken along line V,I—V,I as seen in the direction of the arrow in the FIG. 5A.
Figure 5C:
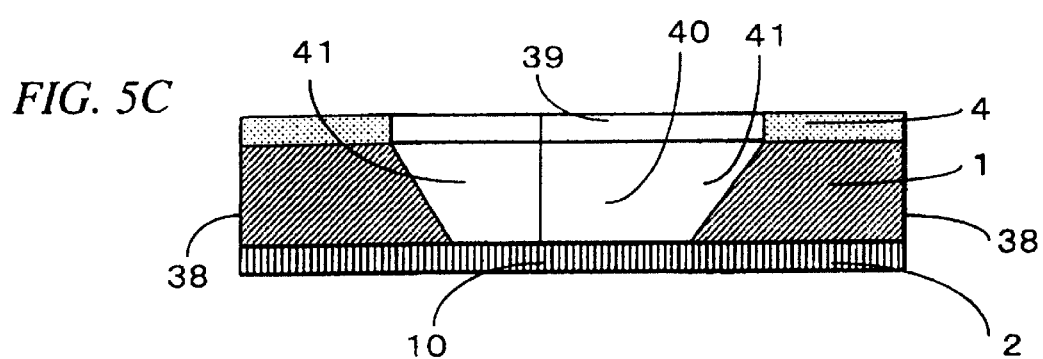
FIG. 5C is a sectional view taken along line V,II—V,II as seen in the direction of the arrow in FIG. 5A.

FIG. 5A is a plan view showing an $SiO_2$ thin film mask pattern used for precision etching of a (110) $SrTiO_3$ monocrystal substrate and a fabrication state of the substrate in an example. FIG. 5B is a sectional view taken along line V,I—V,I as seen in the direction of the arrow in FIG. 5A, and FIG. 5C is a sectional view taken along line V,II—V,II as seen in the direction of the arrow in FIG. 5A. In these drawing figures, reference numeral 2 indicates a (110) $SrTiO_3$ monocrystal substrate, and a side face 30 of the substrate 2 has a (111) plane.

On the surface of the substrate 1, an $SiO_2$ thin film is formed in the same manner as in Embodiment I or II. Then, a hexagonal window 39 is formed in the $SiO_2$ thin film 4, and the same process steps as those in Embodiment I or II are carried out. In this example, on a pair of parallel sides of the window 39, there are provided adjacent corner angles of 125.26 deg. and 109.48 deg. On a cross section V,I—V,I, a formed opening 40 has vertical internal side walls as shown in FIG. 5B, and on cross section V,II—V,II, the opening 40 has an inverted pyramidal shape. Finally, a $YBa_2Cu_3O_{7-\delta}$ high-temperature superconductor film 2 is exposed to form a self-supporting film 10. At this step, a (111) plane is exposed on an internal side wall 41 of the opening 40, and a (111) plane is exposed on an internal side wall 39 thereof. Thereafter, the $SiO_2$ thin film 4 used for patterning is removed.

In practicing the present invention according to either of the above-mentioned examples, a self-supporting film 10 will be formed properly. It should be noted, however, that a window configuration is based on a crystallographic plane of an $SrTiO_3$ monocrystal substrate to be subjected to etching process.

Embodiment IV

With reference to FIGS. 6A1 to 6I, the following describes an example in which a magnetic force microscope (MFM) probe is fabricated by forming a stylus out of a high-temperature superconductor thin film deposited on an $SrTiO_3$ monocrystal substrate and forming a beam out of a part of the $SrTiO_3$ monocrystal substrate.

First, on a (100) plane on one side of a double-side polished (100) $SrTiO_3$ monocrystal substrate 1, a $YBa_2Cu_3O_{7-\delta}$ high-temperature superconductor thin film 2 is formed, and then $SiO_2$ thin films 3 and 4 are evaporated onto both sides thereof respectively. A part of the $SiO_2$ thin film 4, which is formed on the side opposite from the $YBa_2Cu_3O_{7-\delta}$ high-temperature superconductor thin film 2, is removed to provide a window 47. FIG. 6A1 shows a sectional view of this state, and FIG. 6A2 shows a plan view thereof. The sectional view in FIG. 6A1 is taken along line VI,I—VI,I as seen in the direction of the arrow in FIG. 6A2 (each pair of drawings in FIG. 6 is shown in the same manner as for FIGS. 6A1 and 6A2). When a center part corresponding to the window 47 is removed from the $SiO_2$ thin film 4 on the (100) $SrTiO_3$ monocrystal substrate 1, there is left an island 50 of the $SiO_2$ thin film 4 which has a horizontal convex shape.

In the same fashion as for fabrication of the self-supporting film 10 for the $YBa_2Cu_3O_{7-\delta}$ high-temperature superconductor thin film in Embodiment 1, anisotropic etching with phosphoric acid is performed to a proper depth to form an opening 48. FIG. 6B1 shows a sectional view of this state, and FIG. 6B2 shows a plan view thereof. At this step, the island 50 having the $SiO_2$ thin film on the top thereof is made higher than the surrounding area thereof.

Then, by means of lithography, the area of the window 47 formed in the $SiO_2$ thin film 4 is increased inward to form a window 49. Resultantly, a part of the $SiO_2$ thin film 4 on the top of the island 50 removed, i.e., an island 51 having the surface of the (100) $SrTiO_3$ monocrystal substrate 1 exposed is formed. FIG. 6C1 shows a sectional view of this state, and FIG. 6C2 shows a plan view thereof.

Subsequently, anisotropic etching with phosphoric acid is performed. In the (100) $SrTiO_3$ monocrystal substrate 1, the anisotropic etching with phosphoric acid proceeds while keeping a step difference between the opening 48 and the island 51 intact in mutual relationship. The island 50 having the $SiO_2$ thin film on the top thereof is not etched. FIG. 6D1 shows a sectional view of this state, and FIG. 6D2 shows a plan view thereof.

The anisotropic etching with phosphoric acid is continued on the (100) $SrTiO_3$ monocrystal substrate 1 until a part 53 of the $YBa_2Cu_3O_{7-\delta}$ high-temperature superconductor thin film 2 is exposed. That is, the anisotropic etching with phosphoric acid is terminated at the moment the part 53 of the $YBa_2Cu_3O_{7-\delta}$ high-temperature superconductor is exposed. Then, the $SiO_2$ thin film 4 is removed. FIG. 6E1 shows a sectional view of this state, and FIG. 6E2 shows a plan view thereof. In FIGS. 6E1 and 6E2, reference numeral 52 indicates a state of the island 50 with the $SiO_2$ thin film 4 removed from the top thereof.

Figure 6F:
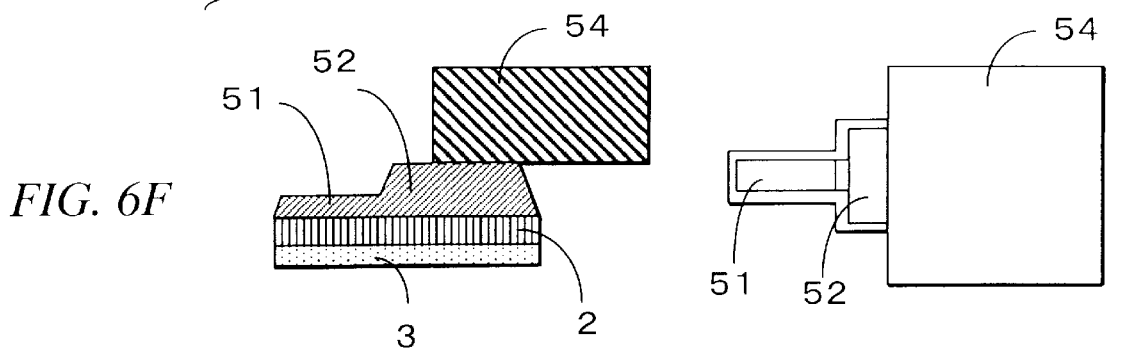

Then, a region enclosed in dot-dash lines indicted in FIG. 6E2 is cut out mechanically. A holder 54 is fixed onto the island 50 of the region thus cut out. The holder 54 is made of a material such as glass, and the holder 54 is used as a mounting part for a magnetic force microscope (MFM) probe in the present preferred embodiment. In FIG. 6F, a sectional view of this state is shown at the left, and a plan view thereof shown at the right. The island 52 formed out of the (100) $SrTiO_3$ monocrystal substrate 1 has the holder 54 fixed on the top thereof, and the island 51 is provided as a lower part extending from the island 52. On the other side of the (100) $SrTiO_3$ monocrystal substrate 1, the $YBa_2Cu_3O_{7-\delta}$ high-temperature superconductor thin film 2 and the $SiO_2$ thin film 3 remain in lamination.

Figure 6G:
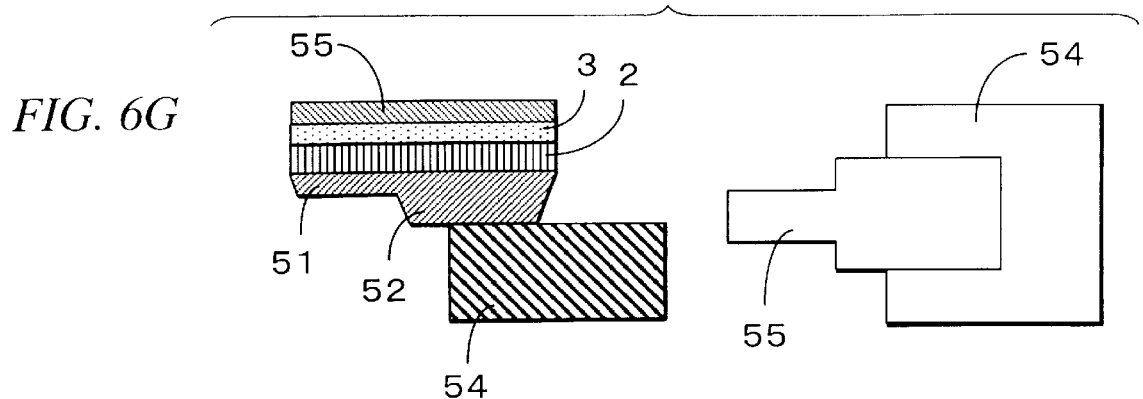

Then, a resist layer 55 is formed on the $SiO_2$ thin film 3. This state is shown in FIG. 6G, wherein the schemes shown in FIG. 6F are inverted.

Figure 6H:
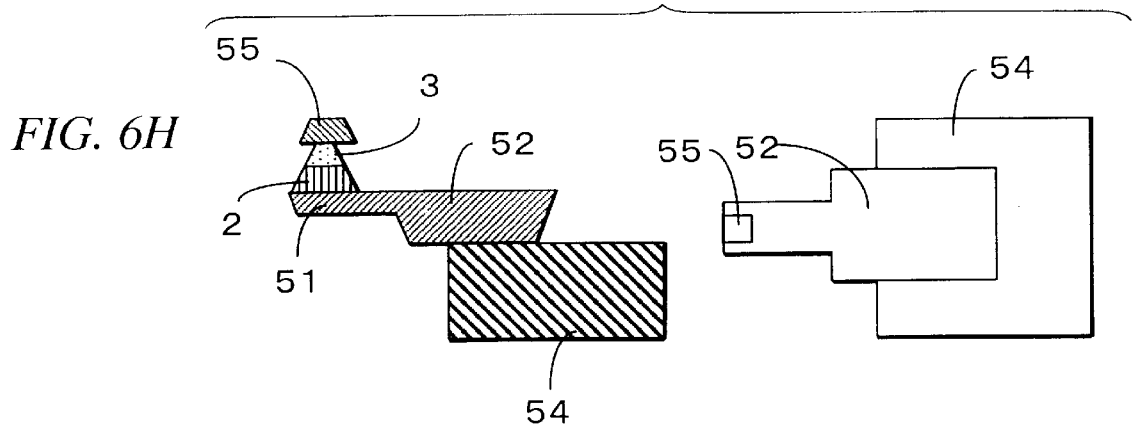

Lithography is performed to form a stylus through the resist layer 55. Then, ion milling with argon ions or the like is carried out to remove unnecessary parts of the $SiO_2$ thin film 3 and the $YBa_2Cu_3O_{7-\delta}$ high-temperature semiconductor thin film 2. This state is shown in FIG. 6H, in which the etching of the $SiO_2$ thin film 2 and the $YBa_2Cu_3O_{7-\delta}$ high-temperature superconductor thin film 2 for forming a stylus is in progress with a part of the resist layer 55 remaining.

Figure 6I:
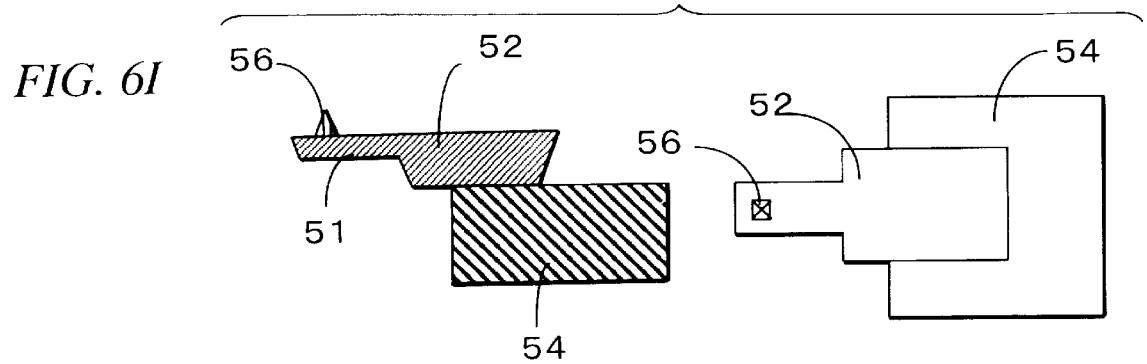

As shown in FIG. 6I, after removal of the resist layer 55, the $SiO_2$ thin film 3 is further removed by an ion etching method using a reactant gas such as $CHF_3$. Thus, a magnetic force microscope probe can be fabricated which comprises a stylus 56 formed out of the $YBa_2Cu_3O_{7-\delta}$ high-temperature superconductor thin film 2 and a beam 51 formed out of the $SrTiO_3$ monocrystal substrate 1.

Figure 7:
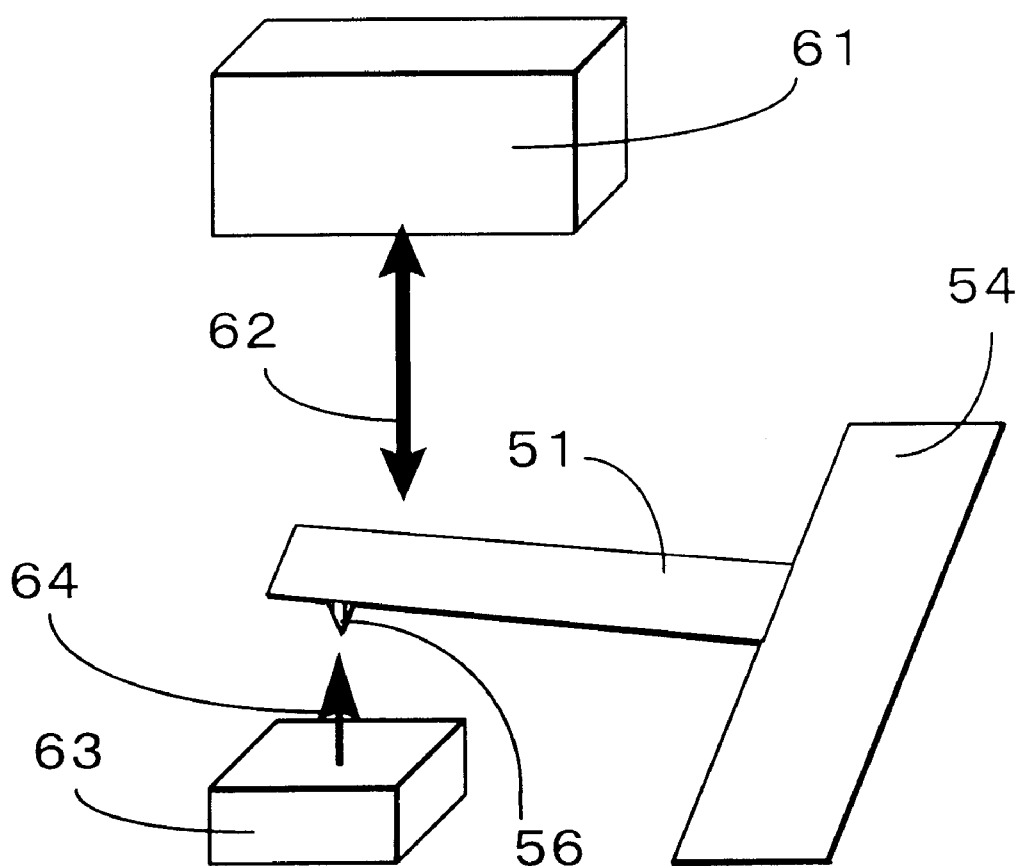
FIG. 7 is a schematic diagram showing an operating principle of the magnetic force microscope probe using the Meissner effect, which is fabricated as shown in FIGS. 6A1 to 6I.

FIG. 7 is schematic diagram showing an operating principle of the magnetic force microscope probe fabricated as mentioned above. The stylus 56 formed out of the $YBa_2Cu_3O_{7-\delta}$ high-temperature superconductor thin film is provided at the tip of the beam 51 retained with the holder 54. A metal thin film is evaporated onto the side opposite from the stylus 56 for enhancement in photoreflective characteristic. The stylus 56 of the probe is brought close to the surface of a specimen 63, and the stylus 56 is cooled down to have a superconducting state. Then, the Meissner effect lets the stylus 56 act to exclude a magnetic field 64 produced by the specimen 63, causing minuscule displacement on the beam 51 of the probe. A degree of this displacement is measured by applying laser radiation 62 to a part of the beam 51 of the probe from a laser interferometer 61 containing a laser source. Thus, an intensity of the magnetic field 64 on the surface of the specimen 63 can be determined. In a conventional magnetic force microscope in which a magnetic material is evaporated on the stylus tip of a probe fabricated using a silicon microfabrication technique for an atomic force microscope, there is a disadvantage that a magnetic field of the magnetic material has an effect on a specimen. In the present preferred embodiment, since repulsion of the high-temperature superconductor thin film due to the Meissner effect is detected, it is not required to provide a magnetic material on the stylus. The above-mentioned disadvantage in the conventional technique can therefore be obviated according to the present preferred embodiment.

Embodiment V

FIG. 8 shows a preferred embodiment of fabrication of mold patterns according to the present invention. FIGS. 8A and 8B are perspective views for explaining an example of forming a pyramidal opening in a (100) $SrTiO_3$ monocrystal substrate and forming a pyramidal protrusion on another substrate by the use of the thus formed pyramidal opening as a mold pattern. FIGS. 8C and 8D are perspective views for explaining an example of forming a substantially rectangular parallelepiped opening in a (110) $SrTiO_3$ monocrystal substrate and forming a substantially rectangular parallelepiped protrusion on another substrate by the use of the thus formed rectangular parallelepiped opening as a mold pattern.

Figure 8A:
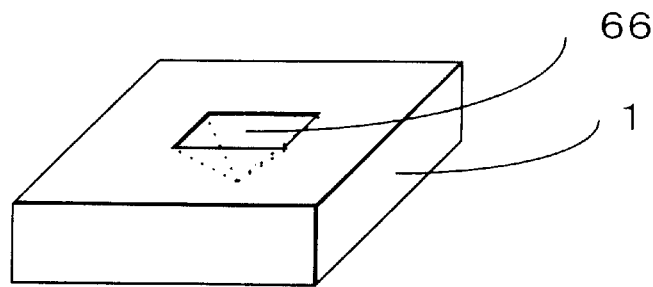
FIGS. 8A and 8B are perspective views for assisting the explanation of an example of forming a pyramidal opening in a (100) $SrTiO_3$ monocrystal substrate and forming a pyramidal protrusion on another substrate by the use of the pyramidal opening as a mold pattern according another preferred embodiment of the present invention.
Figure 8B:
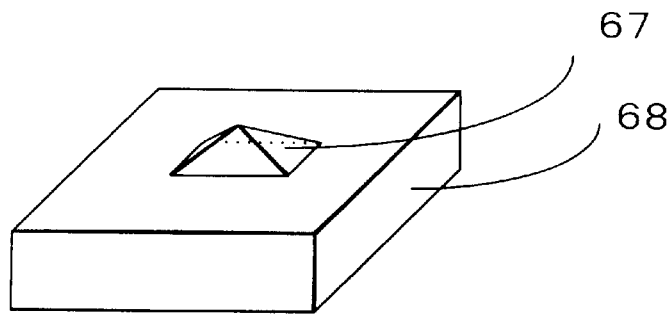
Figure 8C:
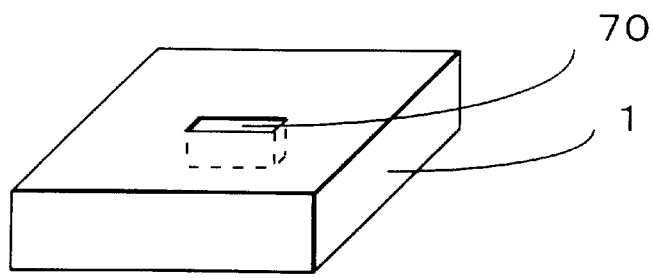
FIGS. 8C and 8D are perspective views for assisting the explanation of an example of forming a substantially rectangular parallelepiped opening in a (110) $SrTiO_3$ monocrystal substrate and forming a substantially rectangular parallelepiped protrusion on another substrate by the use of the rectangular parallelepiped opening as a mold pattern according to another preferred embodiment of the present invention.

On a (100) $SrTiO_3$ monocrystal substrate 1, a pyramidal opening 66 (FIG. 8A) can be formed therein in the same manner as that described in connection with FIGS. 4A and 4B. Using the thus formed pyramidal opening 66 as a mold pattern, a pyramidal protrusion 67 can be formed on a substrate 68 made of a proper material (FIG. 8B).

Figure 8D:
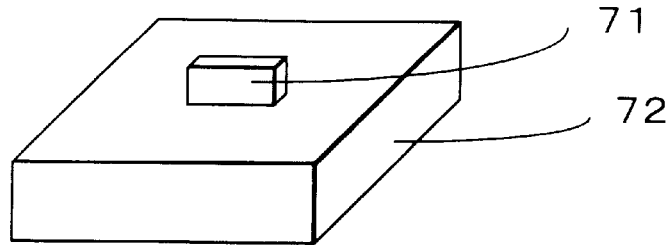

On a (110) $SrTiO_3$ monocrystal substrate 1, a substantially rectangular parallelepiped opening 70 (FIG. 8C) can be formed therein using a proper mask in the same manner as that described in connection with FIGS. 5A and 5B. Using the thus formed rectangular parallelepiped opening as a mold pattern, a substantially rectangular parallelepiped protrusion 71 can be formed on a substrate 72 made of a proper material (FIG. 8D). In fabrication using the (110) $SrTiO_3$ monocrystal substrate 1, an exactly rectangular parallelepiped opening is not formed therein in a strict sense, i.e., the opening has a slope corresponding to the internal side wall 41. However, a substantially rectangular parallelepiped opening can be formed, thereby allowing formation of the rectangular parallelepiped protrusion 71.

It will be appreciated that a mold microfabricated from an $SrTiO_3$ monocrystal substrate as in the present preferred embodiment can be used for pattern transfer to any material other than silicon, e.g., the present preferred embodiment is applicable to production of CD-ROMs or the like.

Embodiment VI

FIGS. 9A to 9F show a preferred embodiment of Josephson junction fabrication according to the present invention.

First, an $SiO_2$ thin film is evaporated onto an $SrTiO_3$ monocrystal substrate 1. This state (FIG. 9A) is the same as that shown in FIG. 2A in Embodiment II.

Then, a window 5 is formed in the $SiO_2$ thin film 4 by lithography. This state (FIG. 9B) is the same as that shown in FIG. 2B in Embodiment II.

Figure 9A:
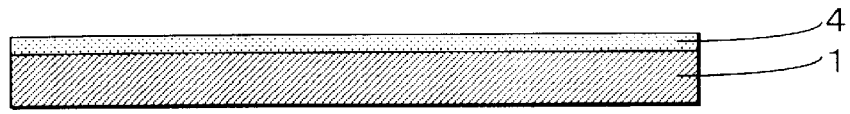
FIGS. 9A to 9E are sectional views showing an example of a fabrication process of a Josephson junction according to another preferred embodiment of the present invention.
Figure 9B:
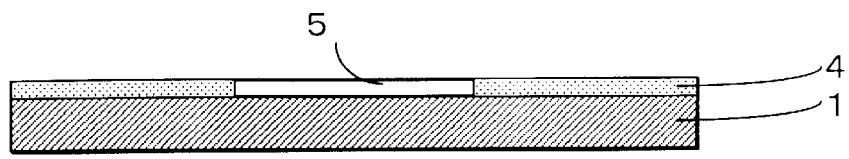
Figure 9C:
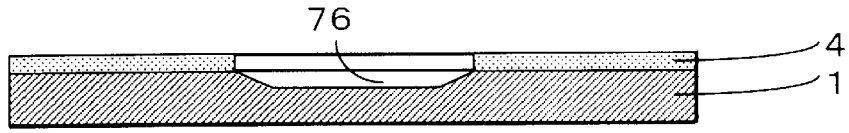

The $SrTiO_3$ monocrystal substrate thus processed is put into an $H_3PO_4$ solution maintained at a boiling point of approximately 150 deg. C to make anisotropic etching on the $SrTiO_3$ monocrystal substrate 1. The anisotropic etching is terminated by selecting a proper period of etching time. Thus, an opening 76 can be formed in the $SrTiO_3$ monocrystal substrate 1 (FIG. 9C).

Figure 9D:
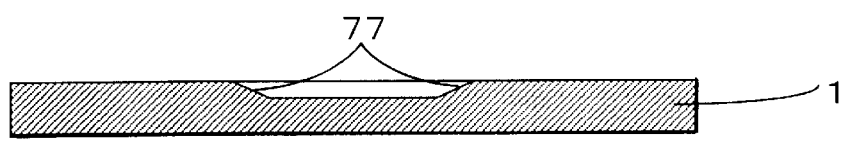

Then, the $SiO_2$ thin film 4 is removed to provide a step difference part having a certain angle in the $SrTiO_3$ monocrystal substrate 1. The angle of the step difference part is determined depending on the crystal orientation of the $SrTiO_3$ monocrystal substrate 1. In the use of a (100) $SrTiO_3$ monocrystal substrate, the step difference part is formed to have a slope angle of 54.74 deg., and in the use of a (110) $SrTiO_3$ monocrystal substrate, the step difference part is formed to have a slope angle of 90 deg. (FIG. 9D).

Figure 9E:
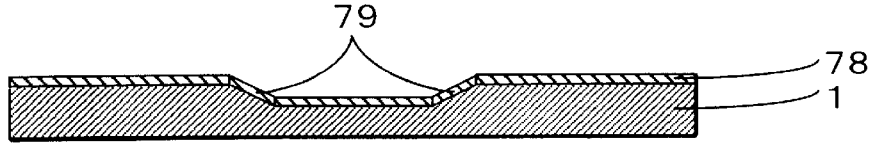

On the $SrTiO_3$ monocrystal substrate 1 having such a step difference part, a $YBa_2Cu_3O_{7-\delta}$ high-temperature superconductor thin film 78 is formed to provide a step difference part 79, which will function as a Josephson junction (FIG. 9E).

Figure 9F:
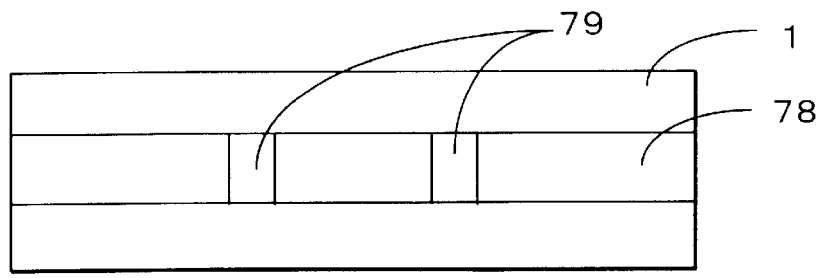
FIG. 9F is a plan view showing the Josephson junctions fabricated in the above process.

FIG. 9F shows a plan view of the $SrTiO_3$ monocrystal substrate 1 comprising two cascaded Josephson junctions 79 formed on the $YBa_2Cu_3O_{7-\delta}$ high-temperature superconductor thin film 78. According to the present preferred embodiment, since a slope angle of a step difference part is geometrically predetermined, a Josephson junction having high reproducibility can be fabricated advantageously.

Embodiment VII

Figure 10A:
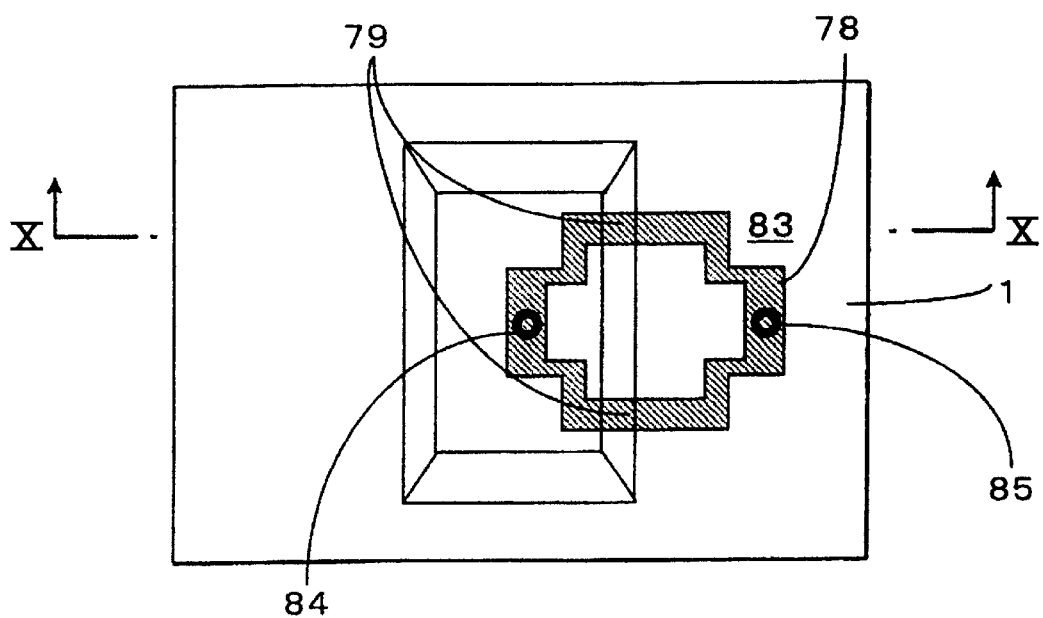
FIG. 10A is a plan view showing an example of a superconducting quantum interference device (SQUID) using a Josephson junction exemplified in FIG. 9F.
Figure 10B:
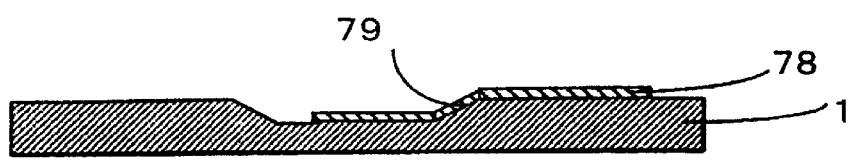
FIG. 10B is a sectional view taken along line X—X as seen in the direction of the arrow in FIG. 10A.

FIG. 10A shows a plan view of a preferred embodiment of a superconducting quantum interference device (SQUID) using a Josephson junction fabricated in Embodiment VI, and FIG. 10B shows a sectional view taken along line X—X as seen in the arrow direction in FIG. 10A.

First, as described in connection with FIG. 9E, a Josephson junction of a $YBa_2Cu_3O_{7-\delta}$ high-temperature superconductor thin film 78 is fabricated on an $SrTiO_3$ monocrystal substrate 1. Then, on the $YBa_2Cu_3O_{7-\delta}$ high-temperature superconductor thin film 78 formed on the $SrTiO_3$ monocrystal substrate 1, a superconducting loop circuit 83 containing two Josephson junctions 79 is formed by lithography (FIG. 10A).

At both the ends of the superconducting loop circuit 83, current-voltage terminals 84 and 85 are provided respectively. Thus, a superconducting quantum interference device (SQUID) can be realized which is used to measure a current and voltage across these terminals.

Embodiment VIII

The present preferred embodiment shows an example of fabricating a self-supporting film for an $SrTiO_3$ monocrystal substrate. The present preferred embodiment is essentially similar to an example of a fabrication process of the self-supporting film for the $YBa_2Cu_3O_{7-\delta}$ high-temperature superconductor thin film formed on the $SrTiO_3$ monocrystal substrate described in connection with FIG. 1, but wherein a self-supporting film for an $SrTiO_3$ monocrystal substrate is formed instead of the self-supporting film for the $YBa_2Cu_3O_{7-\delta}$ high-temperature superconductor thin film.

Figure 11A:
FIGS. 11A to 11F are sectional views showing an example of a fabrication process of a self-supporting film for an $SrTiO_3$ monocrystal substrate according to another preferred embodiment of the present invention.

First, a double-side polished (100) $SrTiO_3$ monocrystal substrate 1 having a thickness of approximately 250 μm has been prepared (FIG. 11A).

Figure 11B:
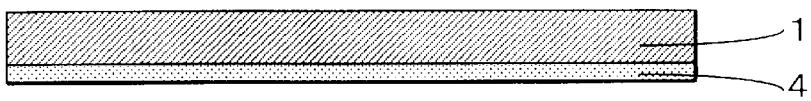

An $SiO_2$ thin film 4 having a thickness of approximately 1000 nm is evaporated onto a (100) plane on one side of the $SrTiO_3$ monocrystal substrate 1 (FIG. 11B.

Figure 11C:
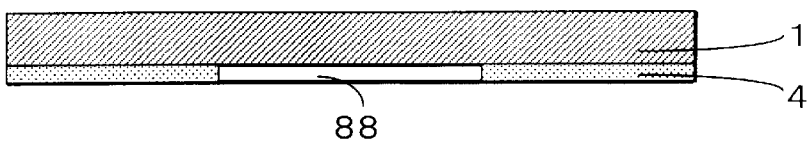

On the $SiO_2$ thin film 4, a predetermined etching mask is patterned by an ion etching method using a reactant gas such as $CHF_3$. Thus, a window 88 is formed in the $Sio_2$ thin film 4 (FIG. 11C)

Figure 11D:
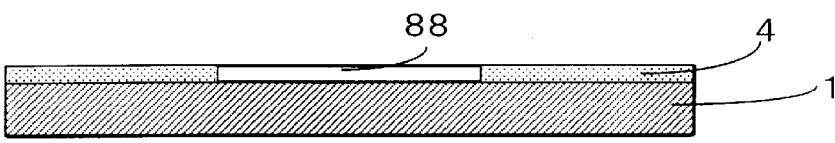

Then, using silicone rubber 6, the entire substrate 1 with the $SiO_2$ thin film 4 facing up is closely attached to a backing substrate made of a material such as slide glass 7 resistant to etching with a $H_3PO_4$ solution (FIG. 11D).

Figure 11E:
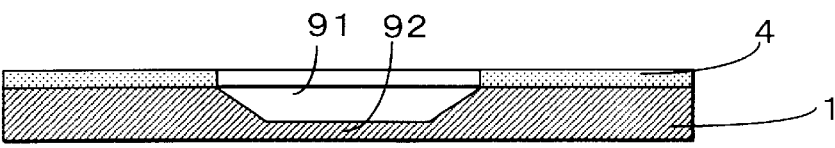

The $SrTiO_3$ monocrystal substrate 1 thus processed is put into an $H_3PO_4$ solution maintained at a boiling point of approximately 150 deg. C to make anisotropic etching on the $SrTiO_3$ monocrystal substrate 1 through the window 88. A proper period of etching time is selected to form an opening 91 in the $SrTiO_3$ monocrystal substrate 1 so that a part of the $SrTiO_3$ monocrystal substrate 1 is left as a self-supporting film 92 (FIG. 11E).

Figure 11F:
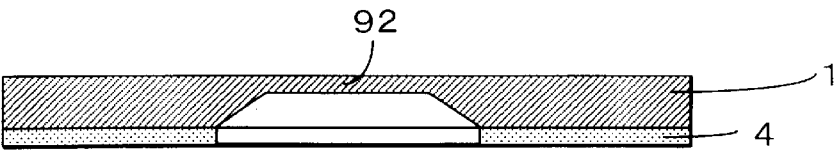

Finally, the entire substrate 1 is separated from the backing plate (slide glass 7), and residual silicone rubber 6 is removed therefrom. Thus, a self-supporting film 92 can be formed for the $SrTiO_3$ monocrystal substrate 1 (FIG. 11F).

Embodiment IX

Figure 12A:
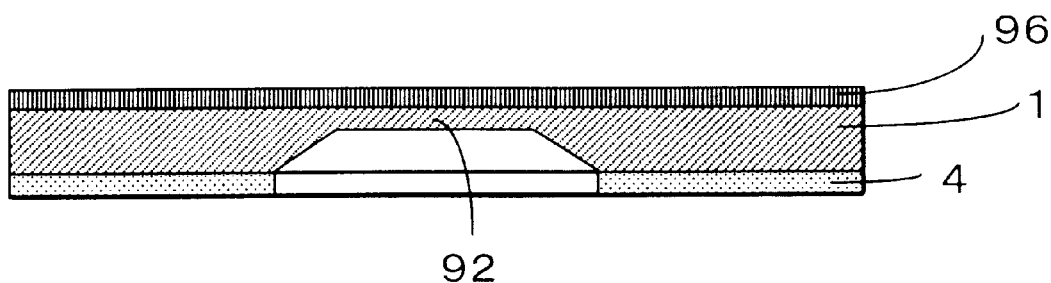
FIGS. 12A is a sectional view showing a fabrication process of a electric field sensor according to another preferred embodiment of the present invention.
Figure 12B:
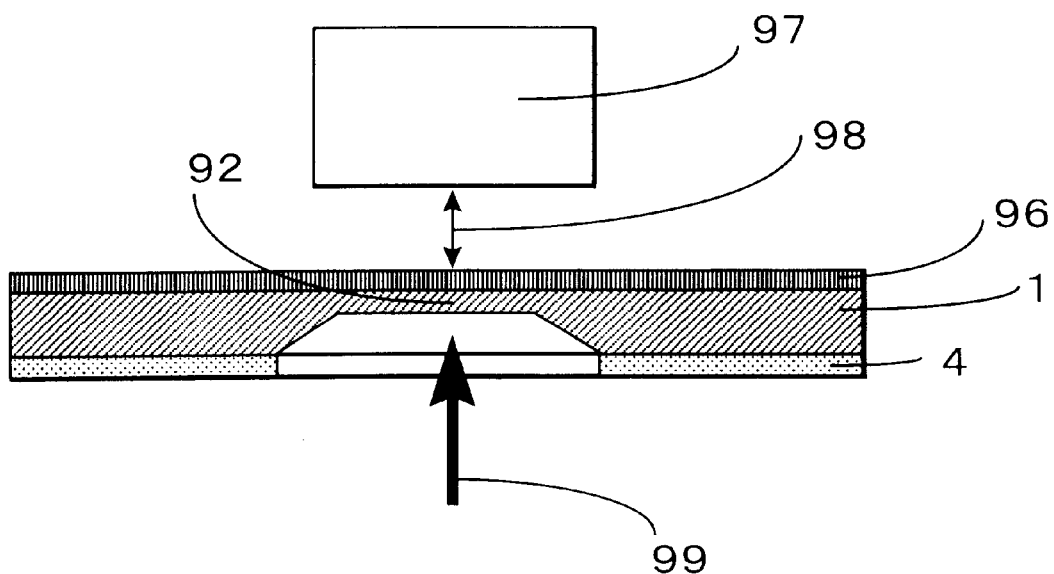
FIG. 12B is an explanatory diagram showing an operating principle of the electric field sensor fabricated in the above process.

FIGS. 12A and 12B show an embodiment of a electric field sensor using a self-supporting film for an $SrTiO_3$ monocrystal substrate fabricated as in Embodiment VIII.

First, as described in Embodiment VIII, an SrTiO$_3$ monocrystal substrate 1 having a self-supporting film 92 is prepared. Then, on the self-supporting film 1, a metal thin film 96 is evaporated for enhancement in photoreflective characteristic (FIG. 12A).

FIG. 12B is an explanatory diagram showing an operating principle of a electric field sensor using the self-supporting film 1 thus processed. Since the SrTiO$_3$ monocrystal substrate is a dielectric, an external electric field 99 causes polarization to occur thereon, resulting in distortion of the self-supporting film 92. This distortion of the self-supporting film 92, i.e., a degree of displacement thereof is measured by means of a laser beam 98 from a laser interferometer 97 containing a laser source. Thus, a micro electric field sensor can be realized.

As set forth hereinabove, the present invention makes it possible to fabricate microstructures from a variety of materials such as high-temperature superconductor and dielectric materials. It will therefore be appreciated that the present invention can realize what has hitherto been technically infeasible by a conventional silicon microfabrication technique, contributing to a further advance in micromachining technology.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A microfabrication method, comprising the steps of:
   (a) providing an SrTiO$_3$ monocrystal substrate having a (100) plane on a surface thereof;
   (b) forming an SiO$_2$ film on said (100) plane of said SrTiO$_3$ monocrystal substrate;
   (c) removing a part of said SiO$_2$ film according to a predetermined pattern;
   (d) providing an H$_3$PO$_4$ solution maintained at a predetermined temperature;
   (e) immersing said SrTiO$_3$ monocrystal substrate resulting from step (c) in said H$_3$PO$_4$ solution for a predetermined period of time; and
   (f) taking said SrTiO$_3$ monocrystal substrate out of said H$_3$PO$_4$ solution.

2. A microfabrication method as claimed in claim 1, further comprising the steps of:
   (g) after step (f), removing said SiO$_2$ film from said (100) plane on the surface of said SrTiO$_3$ monocrystal substrate; and
   (h) after step (g), epitaxially growing a YBa$_2$Cu$_3$O$_{7-\delta}$ high-temperature superconductor thin film on said (100) plane on the surface of said SrTiO$_3$ monocrystal substrate.

3. A microfabrication method as claimed in claim 1, further comprising the step of:
   (g) after step (f), epitaxially growing a YBa$_2$Cu$_3$O$_{7-\delta}$ high-temperature superconductor thin film on a (100) plane on the back side of said SrTiO$_3$ monocrystal substrate.

4. A microfabrication method as claimed in claim 1, further comprising the steps of:
   (g) applying a part to be molded to said (100) plane of said SrTiO$_3$ monocrystal substrate taken out of said H$_3$PO$_4$ solution; and
   (h) separating said part thus molded from said SrTiO$_3$ monocrystal substrate.

5. A microfabrication method, comprising the steps of:
   (a) providing an SrTiO$_3$ monocrystal substrate having (100) planes on mutually opposed surfaces thereof;
   (b) epitaxially growing a YBa$_2$Cu$_3$O$_{7-\delta}$ high-temperature superconductor thin film on one of said (100) planes of said SrTiO$_3$ monocrystal substrate;
   (c) forming an SiO$_2$ film on said YBa$_2$Cu$_3$O$_{7-\delta}$ high-temperature superconductor thin film;
   (d) forming an SiO$_2$ film on the other one of said (100) planes of said SrTiO$_3$ monocrystal substrate;
   (e) removing a part of said SiO$_2$ film from said other one of said (100) planes of said SrTiO$_3$ monocrystal substrate according to a predetermined pattern;
   (f) forming a protective material on said SiO$_2$ film on said YBa$_2$Cu$_3$O$_{7-\delta}$ high-temperature superconductor thin film;
   (g) providing an H$_3$PO$_4$ solution maintained at a predetermined temperature;
   (h) immersing said SrTiO$_3$ monocrystal substrate resulting from step (f) in said H$_3$PO$_4$ solution for a period of time required for etching said SrTiO$_3$ monocrystal substrate according to the predetermined pattern corresponding to the removed part of said SiO$_2$ film; and
   (i) taking said SrTiO$_3$ monocrystal substrate out of said H$_3$PO$_4$ solution.

6. A microfabrication method, comprising the steps of:
   (a) providing an SrTiO$_3$ monocrystal substrate having at least one (110) plane on a surface thereof;
   (b) forming an SiO$_2$ film on said (110) plane of said SrTiO$_3$ monocrystal substrate;
   (c) removing a part of said SiO$_2$ film according to a predetermined pattern;
   (d) providing an H$_3$PO$_4$ solution maintained at a predetermined temperature;
   (e) immersing said SrTiO$_3$ monocrystal substrate resulting from step (c) in said H$_3$PO$_4$ solution for a predetermined period of time; and
   (f) taking said SrTiO$_3$ monocrystal substrate out of said H$_3$PO$_4$ solution.

7. A microfabrication method as claimed in claim 6, further comprising the steps of:
   (g) after step (f), removing said SiO$_2$ film from said (110) plane on the surface of said SrTiO$_3$ monocrystal substrate; and
   (h) after step (g), epitaxially growing a YBa$_2$Cu$_3$O$_{7-\delta}$ high-temperature superconductor thin film on said (110) plane on the surface of said SrTiO$_3$ monocrystal substrate.

8. A microfabrication method as claimed in claim 6, further comprising the step of:
   (g) after step (f), epitaxially growing a YBa$_2$CU$_3$O$_{7-\delta}$ high-temperature superconductor thin film on a (110) plane on the back side of said SrTiO$_3$ monocrystal substrate.

9. A microfabrication method as claimed in claim 6, further comprising:
   (g) applying a part to be molded to said (110) plane of said SrTiO$_3$ monocrystal substrate taken out of said H$_3$PO$_4$ solution; and
   (h) separating said part thus molded from said SrTiO$_3$ monocrystal substrate.

10. A microfabrication method, comprising the steps of:

(a) providing an $SrTiO_3$ monocrystal substrate having (110) planes on mutually opposed surfaces thereof;

(b) epitaxially growing a $YBa_2Cu_3O_{7-\delta}$ high-temperature superconductor thin film on one of said (110) planes of said $SrTiO_3$ monocrystal substrate;

(c) forming an $SiO_2$ film on said $YBa_2Cu_3O_{7-\delta}$ high-temperature superconductor thin film;

(d) forming an $SiO_2$ film on the other one of said (110) planes of said $SrTiO_3$ monocrystal substrate;

(e) removing a part of said $SiO_2$ film from said other one of said (110) planes of said $SrTiO_3$ monocrystal substrate according to a predetermined pattern;

(f) forming a protective material on said $SiO_2$ film on said $YBa_2Cu_3O_{7-\delta}$ high-temperature superconductor thin film;

(g) providing an $H_3PO_4$ solution maintained at a predetermined temperature;

(h) immersing said $SrTiO_3$ monocrystal substrate resulting from step (f) in said $H_3PO_4$ solution for a period of time required for etching said $SrTiO_3$ monocrystal substrate according to the predetermined pattern corresponding to the removed part of said $SiO_2$ film; and (i) taking said $SrTiO_3$ monocrystal substrate out of said $H_3PO_4$ solution.

* * * * *